United States Patent
Chance et al.

(10) Patent No.: US 7,592,105 B2
(45) Date of Patent: Sep. 22, 2009

(54) METHODS FOR CONVERTING RETICLE CONFIGURATIONS AND METHODS FOR MODIFYING RETICLES

(75) Inventors: Randall W. Chance, Boise, ID (US); J. Brett Rolfson, Boise, ID (US); Azeddine Zerrade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 11/486,523

(22) Filed: Jul. 13, 2006

(65) Prior Publication Data
US 2006/0257757 A1    Nov. 16, 2006

Related U.S. Application Data

(63) Continuation of application No. 10/686,342, filed on Oct. 14, 2003, now Pat. No. 7,147,974.

(51) Int. Cl.
G03F 1/00 (2006.01)
G03C 5/00 (2006.01)

(52) U.S. Cl. .......................................... 430/5; 430/323
(58) Field of Classification Search ...................... 430/5, 430/22, 30, 322, 323, 324, 394
See application file for complete search history.

(56) References Cited

U.S. PATENT DOCUMENTS

| | | | |
|---|---|---|---|
| 5,194,344 A | 3/1993 | Cathey, Jr. et al. |
| 5,194,345 A | 3/1993 | Rolfson |
| 5,194,346 A | 3/1993 | Rolfson et al. |
| 5,208,125 A | 5/1993 | Lowrey et al. |
| 5,225,035 A | 7/1993 | Rolfson |
| 5,240,796 A | 8/1993 | Lee et al. |
| 5,276,551 A | 1/1994 | Nakagawa |
| 5,372,901 A | 12/1994 | Rolfson et al. |
| 5,376,483 A | 12/1994 | Rolfson |
| 5,468,578 A | 11/1995 | Rolfson |
| 5,480,747 A | 1/1996 | Vasudev |
| 5,495,959 A | 3/1996 | Rolfson |
| 5,576,126 A | 11/1996 | Rolfson |
| 5,667,918 A | 9/1997 | Brainerd et al. |
| 5,672,450 A | 9/1997 | Rolfson |
| 5,766,829 A | 6/1998 | Cathey, Jr. et al. |
| 5,786,116 A | 7/1998 | Rolfson |
| 5,804,336 A | 9/1998 | Rolfson |
| 5,876,878 A | 3/1999 | Pierrat et al. |
| 5,976,732 A | 11/1999 | Pierrat et al. |

(Continued)

*Primary Examiner*—Stephen Rosasco
(74) *Attorney, Agent, or Firm*—Wells St. John P.S.

(57) ABSTRACT

The invention includes methods of converting reticles from configurations suitable for utilization with later generation (shorter wavelength) stepper radiations to configurations suitable for utilization with earlier generation (longer wavelength) stepper radiations. The invention can be utilized for converting a reticle from a configuration suitable for 193 nanometer wavelength radiation to a configuration suitable for 248 nanometer wavelength radiation. In such aspect, a quartz-containing material of a substrate can be protected with a patterned layer consisting essentially of molybdenum and silicon while the quartz-containing material is subjected to a dry etch. The configuration suitable for 248 nanometer wavelength radiation can be constructed so that a phase of 248 nanometer wavelength radiation is shifted by about 180° upon passing through combined thicknesses of the patterned layer and the quartz-containing material, relative to 248 nanometer wavelength radiation which passes only through the quartz-containing material.

20 Claims, 6 Drawing Sheets

U.S. PATENT DOCUMENTS

| | | |
|---|---|---|
| 6,068,951 A | 5/2000 | Pierrat et al. |
| 6,087,047 A * | 7/2000 | Mitsui et al. ............ 430/5 |
| 6,162,568 A | 12/2000 | Pierrat et al. |
| 6,183,915 B1 | 2/2001 | Rolfson |
| 6,395,432 B1 | 5/2002 | Rolfson |
| 6,500,587 B1 | 12/2002 | Ghandehari et al. |
| 6,558,854 B2 | 5/2003 | Pierrat et al. |
| 6,599,666 B2 | 7/2003 | Rolfson |
| 6,627,359 B2 | 9/2003 | Kokubo |
| 6,656,645 B2 | 12/2003 | Tanaka et al. |
| 6,902,851 B1 | 6/2005 | Babcock et al. |
| 7,112,390 B2 * | 9/2006 | Kang et al. ............ 430/5 |

* cited by examiner

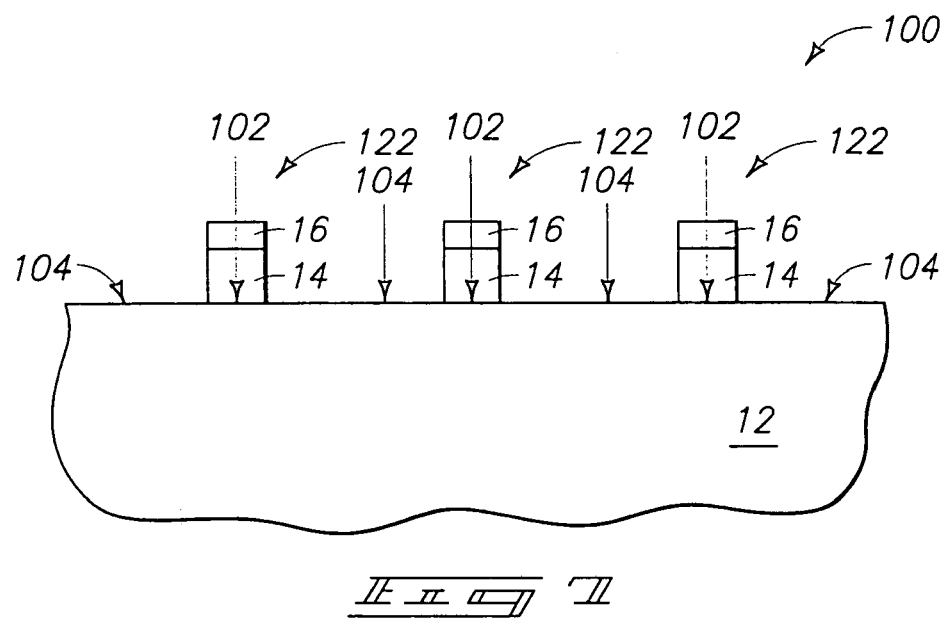
_Fig. 7_
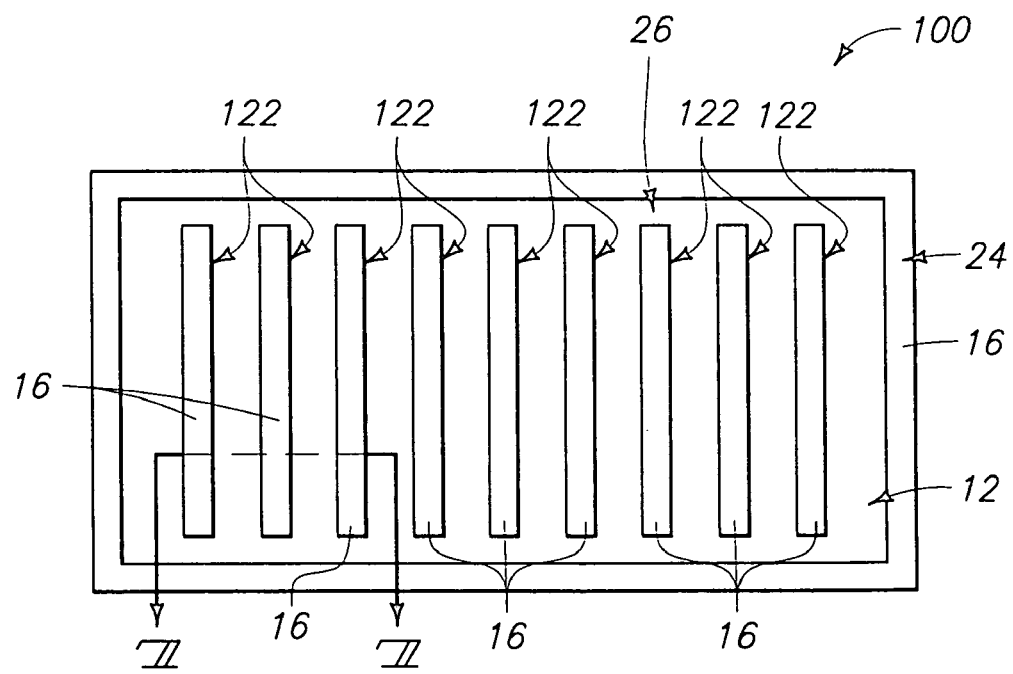
_Fig. 8_

METHODS FOR CONVERTING RETICLE CONFIGURATIONS AND METHODS FOR MODIFYING RETICLES

RELATED PATENT DATA

This patent resulted from a continuation of U.S. patent application Ser. No. 10/686,342, filed Oct. 14, 2003, now U.S. Pat. No. 7,147,974 which is hereby incorporated by reference.

TECHNICAL FIELD

The invention pertains to methods of converting reticle configurations so that reticles suitable for later generation (shorter wavelength) stepper radiation can be adapted for utilization with earlier generation (longer wavelength) stepper radiation.

BACKGROUND OF THE INVENTION

Photolithography is commonly used during formation of integrated circuits associated with semiconductor wafers. More specifically, a form of radiant energy (such as, for example, ultraviolet light) is passed through a radiation-patterning tool and onto a radiation-sensitive material (such as, for example, photoresist) associated with a semiconductor wafer. The radiation-patterning tool can be referred to as a photomask or a reticle. The term "photomask" is traditionally understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses a pattern for either a portion or an entirety of a wafer. For purposes of interpreting this disclosure and the claims that follow, the terms "reticle" and "photomask" are utilized with their modern meanings so that the terms interchangeably refer to tools that encompass patterns for either a portion or an entirety of a wafer. Specifically, the term "reticle" will be used to generically refer to radiation-patterning tools that have patterns for either a portion of a wafer or an entirety of a wafer.

Reticles contain light restrictive regions (for example, totally opaque or attenuated/half-toned regions) and light-transmissive regions (for example, totally transparent regions) formed in a desired pattern. A grating pattern, for example, can be used to define parallel-spaced conductive lines on a semiconductor wafer. As discussed previously, the wafer is provided with a layer of radiation-sensitive material (such as, for example, photosensitive resist material, which is commonly referred to as photoresist). Radiation passes through the reticle onto the layer of photoresist and transfers a pattern defined by the reticle onto the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

A prior art method of forming a reticle is described with reference to FIGS. 1-5. Referring initially to FIG. 1, a construction 10 is provided. Construction 10 comprises a substrate (or base) 12 having layers 14 and 16 formed thereover.

Substrate 12 of construction 10 will typically comprise, consist essentially of, or consist of material substantially transparent to radiation which is ultimately to be passed through a reticle formed from construction 10. Substrate 12 can, for example, comprise, consist essentially of, or consist of quartz.

Layer 14 of construction 10 comprises a material which attenuates radiation passed through a reticle formed from construction 10, and can be referred to as a radiation-attenuating layer. The material utilized for layer 14 will typically vary depending on the wavelength of radiation which is to be passed through the reticle. Typical materials consist essentially of, or consist of, MoSi, TiN, ZrO, SiNO, and TaHf, with the compositions being shown in terms of the elements contained therein rather than in terms of a particular stoichiometry of the elements.

The reticle formed from construction 10 will typically be fabricated to be utilized with either 157 nanometer wavelength radiation, 193 nanometer wavelength radiation, 248 nanometer wavelength radiation, or 365 nanometer wavelength radiation. The material utilized in layer 14 will typically be MoSi if the reticle is fabricated for utilization with 193 nanometer technology, and can be a different material if the reticle is fabricated for utilization with other technologies.

The specific wavelengths utilized with reticles correspond to specific wavelengths that can be generated with particular lasers. For instance, 193 nanometers corresponds to a wavelength which can be generated utilizing an ArF laser. The 157 nm, 193 nm, 248 nm and 365 nm technologies correspond to specific generations of radiations corresponding to specific generations of photolithography, with each subsequent generation being a shorter wavelength than the previous generation. A common tool utilized in photolithographic processing with reticles is a stepper, and the various generations of radiation are sometimes referred to as generations of stepper radiation.

Layer 16 of construction 10 typically comprises a material which is substantially totally opaque to the radiation which will ultimately be passed through a reticle formed from construction 10. Layer 16 will usually comprise chromium, and can be referred to as a chrome layer.

A layer 18 is formed over layer 16. Layer 18 can comprise a material sensitive to laser radiation and/or e-beam radiation, such as, for example, a photoresist. The radiation is utilized to pattern layer 18.

Referring next to FIG. 2, layer 18 is patterned into a series of structural elements 20, and the pattern from layer 18 is subsequently transferred to layer 16 with a suitable etch.

Referring to FIG. 3, layer 18 (FIG. 2) is removed, and the pattern from layer 16 is transferred to layer 14 with a suitable etch.

Referring to FIG. 4, layer 16 (FIG. 3) is removed. The remaining portions of layer 14 shown in the FIG. 4 view correspond to structural elements 22 formed over substrate 12. Typically, the chromium-containing layer 16 would only be removed from over portions of substrate 12, and would remain over other portions. Such is illustrated in FIG. 5, which shows a top view of the reticle construction 10 at the processing of stage of FIG. 4. Reticle construction 10 comprises an outer periphery 24 and an interior region 26. The patterned portion of the reticle is within the interior region 26, where a series of patterned elements 22 are formed. Chrome-containing layer 16 extends around peripheral region 24, yet has been removed from within interior region 26.

The reticle formed in accordance with the processing of FIGS. 1-5 can subsequently be utilized to pattern light during photolithographic processing. FIG. 6 illustrates reticle construction 10 utilized in a photolithographic process. The reticle 10 is shown inverted relative to the orientation of FIGS. 1-5. Radiation 30 is shown passing through reticle construction 10, and a graphical illustration of the transmittance of the radiation through the reticle construction is shown beneath the reticle construction. Construction 10 is shown to comprise two types of regions with a bar provided between construction 10 and the graph of transmittance. Specifically, construction 10 comprises a first type of region 32 corresponding to locations where structures 22 of material 14 are present, and a second type of region 34 corresponding to locations where structures 22 of material 14 are not present. Radiation 30 passes only through substrate 12 in locations 34 of construction 10, whereas the radiation 30 passes through both material 14 and structure 12 in the second regions 32 of construction 10.

The graphical illustration of transmittance occurring through various regions of construction 10 shows that approximately 100% transmittance occurs through second regions 34, and very little transmittance occurs through first regions 32. The radiation passing through first regions 32 is shifted substantially out of phase relative to the transmittance through second regions 34 (i.e. is shifted by about 180° relative to the radiation passing through second regions 34).

Typically the transmittance through first regions 32 will have an absolute value of less than 10%, with about 6% being common. Since the radiation passing through first regions 32 is out of phase relative to that passing through second regions 34, the transmittance through first regions 32 is shown having a negative value in the graph of FIG. 6. Although negative values of transmission are shown in FIG. 6 to emphasize a phase difference of radiation passing through the first regions of construction 10 relative to the second regions, it is to be understood that typically the percent transmission is expressed as an absolute value. In an effort to avoid confusion throughout this document and in the claims that follow, the claims will utilize the term "absolute transmission" to indicate when an absolute value of transmission is referred to. Additionally, it is noted that the light-restrictive properties of a material can be expressed as attenuation rather than as transmission. For purposes of interpreting this document and the claims that follow, attenuation is defined as being 100 minus the absolute value of percent transmission. Accordingly, the regions 34 of FIG. 6 have an attenuation of about 0, and the regions 32 of FIG. 6 have an attenuation of approximately 94. The attenuation of patterned, partially transparent masks utilized in prior art reticles (e.g., the patterned mask of material 14 of construction 10) is typically greater than 90%, and frequently is about 94%.

SUMMARY OF THE INVENTION

In one aspect, the invention includes a method of converting a reticle from a first configuration suitable for attenuation and approximately 180° phase-shifting of a later generation (shorter wavelength) stepper radiation to a second configuration suitable for attenuation and approximately 180° phase-shifting of an earlier generation (longer wavelength) stepper radiation. The method can include reducing a thickness of a portion of a quartz-containing substrate of the reticle.

In one aspect, the invention encompasses a method of converting a reticle from a first configuration suitable for a shorter wavelength of radiation to a second configuration suitable for a longer wavelength of radiation. The first configuration of the reticle includes a patterned material over a base. The patterned material overlaps first regions of the base and does not overlap second regions of the base. The patterned material has a lower transmission of the shorter and longer wavelengths of radiation than does the base. While the first regions of the base are protected with at least the patterned material, the thickness of the second regions of the base is reduced. The reduction in thickness of the second regions of the base converts the reticle to the second configuration suitable for the longer wavelength of radiation.

In one aspect, the invention encompasses a method of converting a reticle from a first configuration suitable for 193 nm wavelength radiation to a second configuration suitable for 248 nm wavelength radiation. The reticle is initially provided in the configuration suitable for 193 nm wavelength radiation. Such configuration includes a quartz-containing material and a patterned layer consisting essentially of molybdenum and silicon over the quartz-containing material. The patterned layer overlaps first regions of the quartz-containing material and does not overlap second regions of the quartz-containing material. The thickness of the patterned layer relative to a thickness of the quartz-containing material is such that a phase of 193 nm wavelength radiation is shifted by about 180° upon passing through the combined thicknesses of the patterned layer and first regions of the quartz-containing material relative to passing only through the second regions of the quartz-containing material. While the first regions of the quartz-containing material are protected with at least the patterned layer, the second regions of the quartz-containing material are etched with a dry etch to convert the reticle to the second configuration suitable for 248 nm wavelength radiation.

BRIEF DESCRIPTION OF THE DRAWINGS

Preferred embodiments of the invention are described below with reference to the following accompanying drawings.

FIG. 7 is a diagrammatic, cross-sectional view of a reticle fragment shown at a preliminary processing step of an exemplary aspect of the present invention.

FIG. 8 is a top view of a reticle comprising the fragment of FIG. 7 along the line 7-7.

DETAILED DESCRIPTION OF THE PREFERRED EMBODIMENTS

Figure 1:
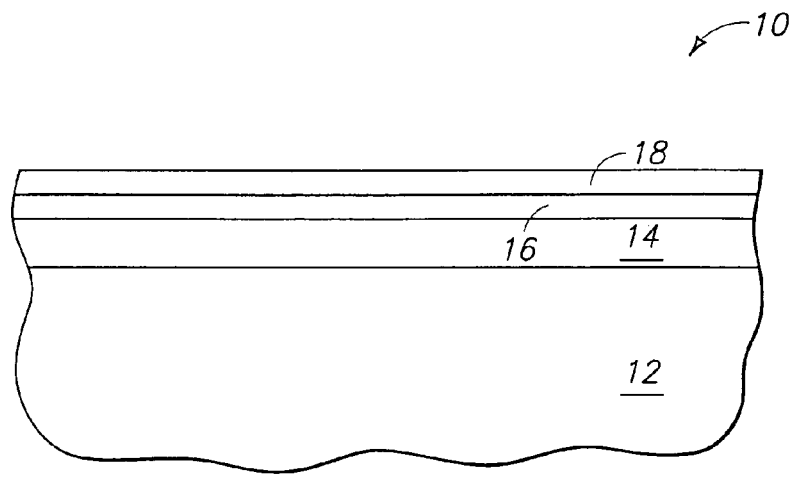
FIG. 1 is a diagrammatic, cross-sectional view of a construction shown at a preliminary step of a prior art method for forming a reticle.
Figure 2:
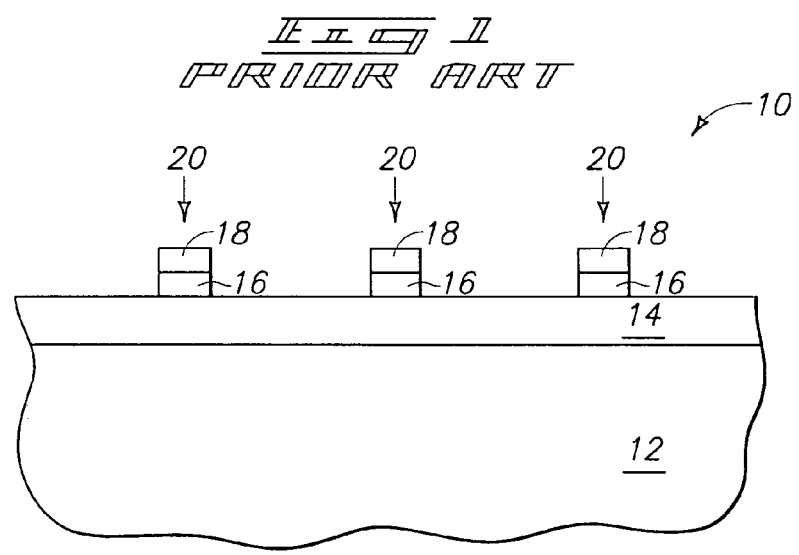
FIG. 2 is a view of the FIG. 1 construction shown at a prior art reticle fabrication step subsequent to that of FIG. 1.
Figure 3:
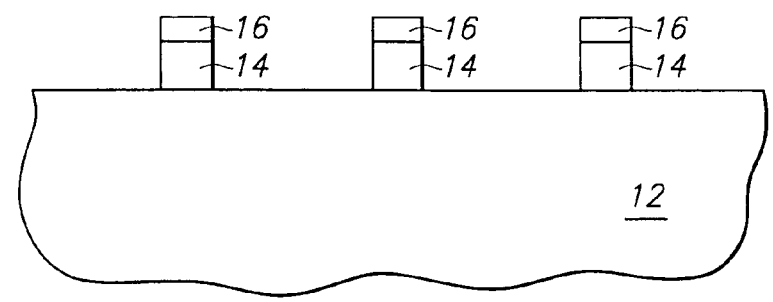
FIG. 3 is a view of the FIG. 1 construction shown at a prior art reticle fabrication step subsequent to that of FIG. 2.
Figure 4:
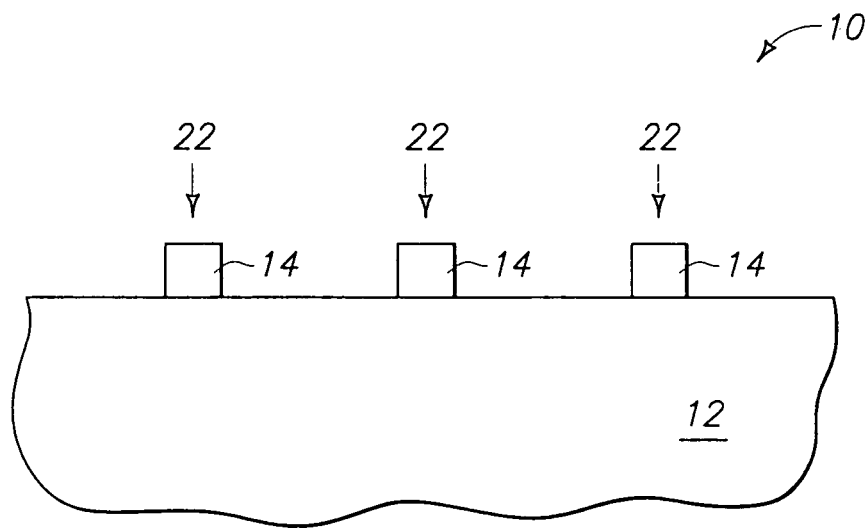
FIG. 4 is a view of the FIG. 1 construction shown at a prior art reticle fabrication step subsequent to that of FIG. 3.
Figure 5:
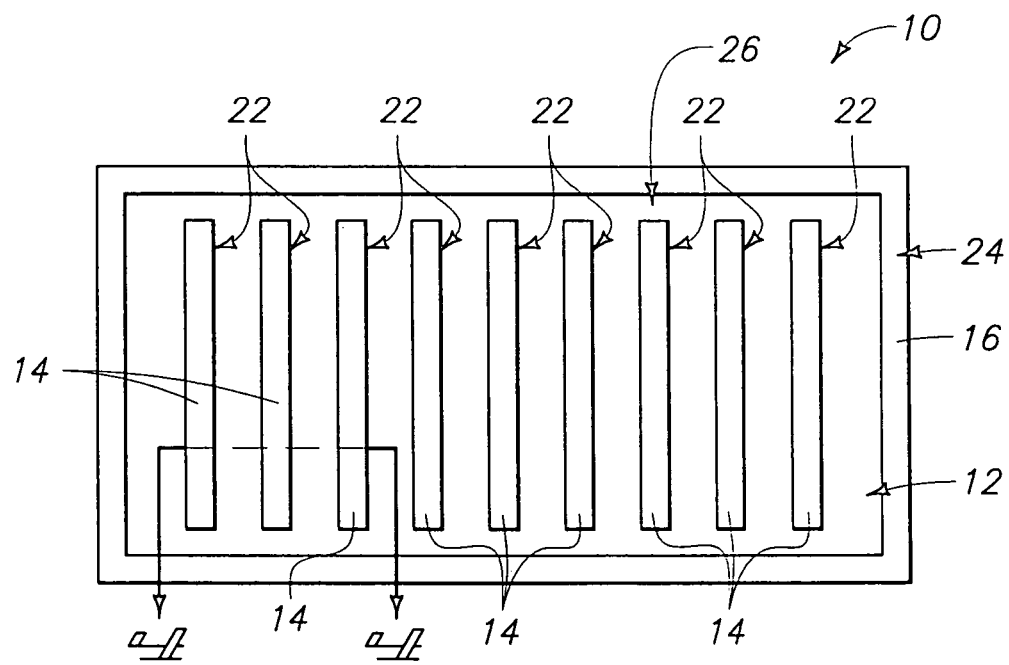
FIG. 5 is a top view of a reticle comprising the fragment of FIG. 4 along the line 4-4.
Figure 6:
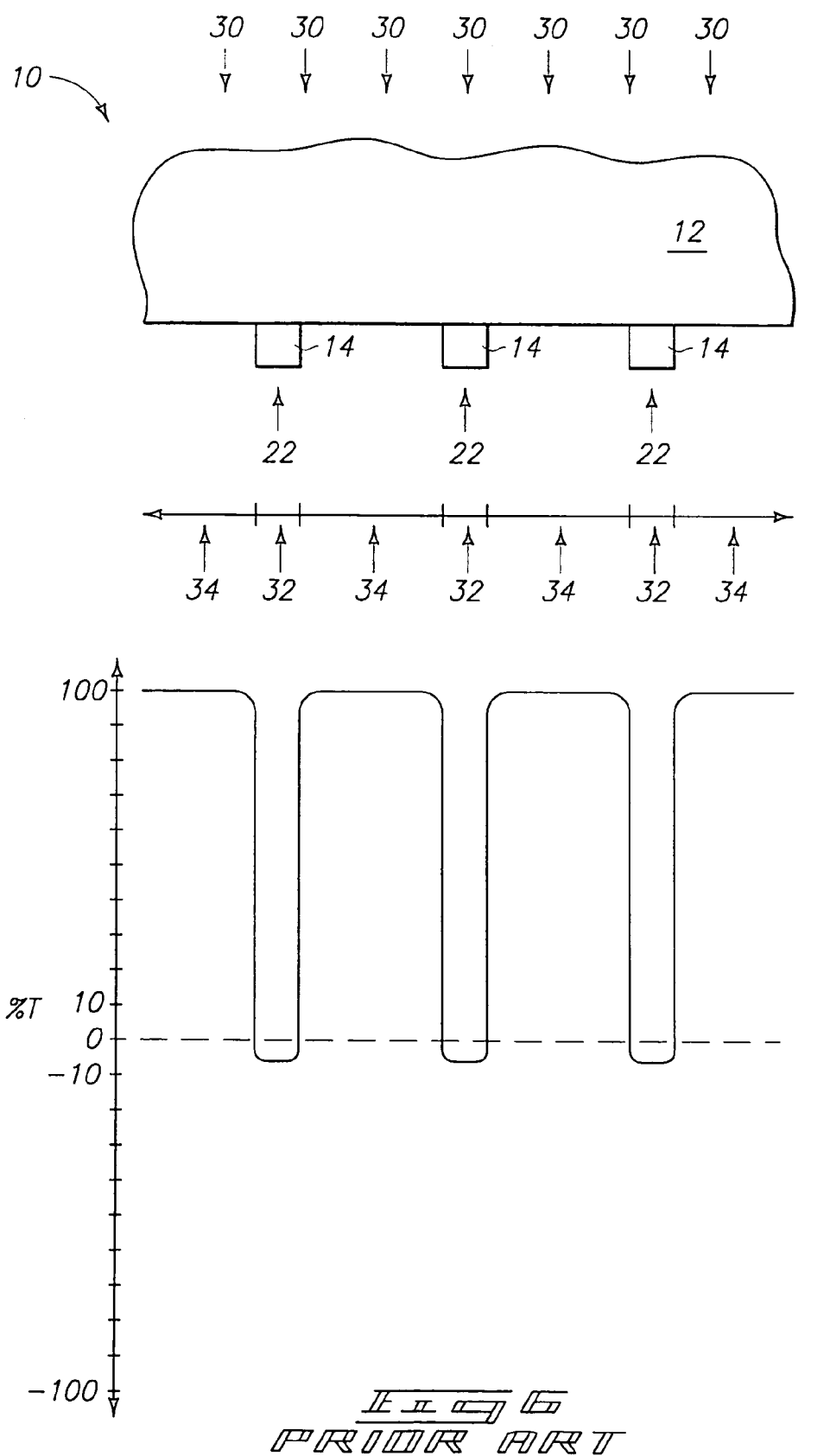
FIG. 6 is a view of the FIG. 4 construction shown in combination with radiation directed toward the reticle, and further shown in combination with a graphical illustration of the percent transmission (% T) of the radiation through various portions of the reticle.

This disclosure of the invention is submitted in furtherance of the constitutional purposes of the U.S. Patent Laws "to promote the progress of science and useful arts" (Article 1, Section 8).

The invention includes methods of converting reticles from configurations suitable for later generation (shorter wavelength) photolithography technology to configurations suitable for earlier generation (longer wavelength) photolithography technology. The trend in the industry has generally been to progress toward shorter wavelength photolithography solutions from longer wavelength solutions. In a sense, the present invention is a recognition that there can be advantages to proceeding along an opposite trend. One aspect of the invention is a recognition that reticles fabricated for the later generation (shorter wavelength) applications can be conveniently adapted for earlier generation (longer wavelength) applications, and that advantages can be achieved through such adaptation. The advantages can include, among other things, increasing an amount of transmission through out-of-phase regions of the reticle relative to in-phase regions of the reticle.

An exemplary aspect of the invention is described with reference to FIGS. 7-11. Referring initially to FIG. 7, a reticle construction 100 is illustrated. Reticle construction 100 comprises several features in common with the reticle construction 10 described previously with reference to the prior art, and such features will be described with similar numbering in the construction of FIG. 7 as was utilized in describing the prior art constructions of FIGS. 1-6.

Construction 100 includes the relatively transparent substrate (or base) 12 described previously, the attenuating material 14 described previously, and the relatively opaque material 16 described previously. Substrate 12 can comprise, consist essentially of, or consist of quartz; layer 14 can comprise, consist essentially of, or consist of MoSi, TiN, ZrO, SiNO, or TaHf (where the compositions are shown in terms of the elements contained therein, rather than in terms of a particular stoichiometry of the elements); and layer 16 can comprise, consist essentially of, or consist of chromium or chromium-containing materials. Layers 14 and 16 are shown patterned into structures 122 which are analogous to the structures 22 described previously with reference to FIG. 4.

The construction 100 of FIG. 7 is identical to the construction 10 described previously with reference to FIG. 3, and can be formed utilizing the processing methods that had been utilized to form the construction of FIG. 3. Although the construction 100 of FIG. 7 is shown comprising only layers 14 and 16 over substrate 12, it is to be understood that the construction can comprise other layers in addition to the layers 14 and 16.

In particular aspects of the invention, layers 14 and 16 can be considered to be patterned materials. Layer 14 can specifically be considered to be a patterned material having a lower transmission of a particular wavelength of radiation than substrate material 12. Substrate 12 can be considered to comprise first regions 102 which are overlapped by patterned material 14, and second regions 104 which are not overlapped by patterned material 14.

Reticle construction 100 will typically be in a configuration suitable for utilization with a particular wavelength of radiation, such as, for example, 157 nanometer wavelength radiation, 193 nanometer wavelength radiation, 248 nanometer wavelength radiation or 365 nanometer wavelength radiation; and in some cases the reticle construction can be considered to be optimized for the particular wavelength of radiation. A thickness of patterned material 14 relative to the thickness of substrate material 12 will typically be such that a particular wavelength of radiation is shifted substantially out of phase (i.e., is shifted by about 180°) upon passing through the combined thicknesses of patterned material 14 and first regions 102 relative to passing through the thickness of the second regions 104. Such has been described previously with reference to FIG. 6 where a prior art reticle is described as having first regions 32 which are overlapped by patterned material 14, and second regions 34 which are not overlapped by patterned material 14, and further where it is described that the first regions shift a particular wavelength of radiation by about 180° relative to the second regions.

The wavelength of radiation which is shifted by 180° upon passing through the first regions relative to the second regions will be the wavelength of radiation for which the reticle is designed to be used with. Thus, if the reticle is designed to be used with 157 nanometer wavelength radiation, the first regions will shift the radiation about 180° out of phase relative to the second regions when the radiation comprises a wavelength of 157 nanometers, but not when the radiation comprises a wavelength corresponding to a different generation of photolithographic processing (such as, for example, a 193 nanometer wavelength, a 248 nanometer wavelength, or a 365 nanometer wavelength). The reticle of FIG. 7 can be a commercially available reticle in a configuration suitable for utilization with a particular wavelength of radiation. For purposes of the discussion that follows, the reticle of FIG. 7 can be referred to as a first configuration reticle, and can be considered suitable for utilization with a shorter (later generation) wavelength of radiation to contrast the reticle of FIG. 7 with a construction formed from such reticle in accordance with aspects of the present invention.

FIG. 8 is a top view of the construction 100 comprising the fragment of FIG. 7. FIG. 8 shows that the construction comprises the outer periphery 24 and interior region 26 described previously with reference to FIG. 5, and further that such construction comprises a plurality of patterned components 122 similar to the patterned components 22 described previously with reference to FIG. 5. The difference between the construction of FIG. 8 and that described previously with reference to FIG. 5 is that the patterned components 122 comprise upper surfaces of chromium-containing material 16, rather than comprising upper surfaces of material 14. The construction of FIG. 8 can be considered to correspond to a construction at the processing stage of FIG. 3, and represents a view which is not shown in describing the prior art.

Figure 9:
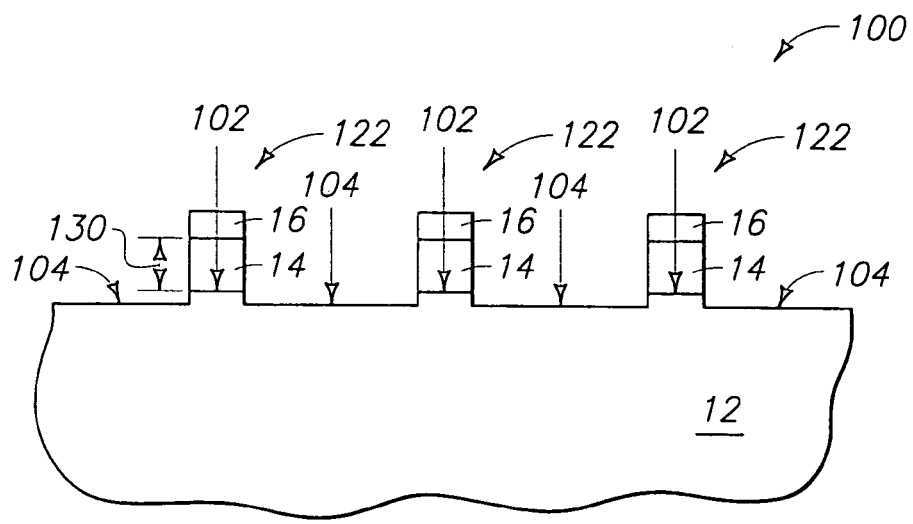
FIG. 9 is a view of the FIG. 7 reticle shown at a processing step subsequent to that of FIG. 7.

FIG. 9 shows construction 100 after the construction has been exposed to an etch which reduces a thickness of second portions 104 of substrate 12. If the exposed surface of substrate 12 comprises, consists essentially of, or consists of quartz, a suitable etch can be a dry etch utilizing, for example, $C_2F_6$. The quartz etch can be a timed etch, with a typical time for an exemplary application in which about 600 Å of quartz is removed being from about 74 seconds to about 77 seconds.

An advantage of leaving chromium-containing layer 16 over material 14 during the etch of substrate 12 is that is frequently easier to selectively etch the material of substrate 12 relative to chromium-containing material 16 than it would be to selectively etch the material of substrate 12 relative to masking material 14. In the shown aspect of the invention, the substrate 12 has about the same thickness in first regions 102 relative to second regions 104 prior to the etch, and after the etch has significantly different thicknesses in first regions 102 relative to second regions 104. Substrate 12 will commonly have a thickness of about 250 mils (0.250 inches), and the etch of second regions 104 will frequently reduce a thickness of such second regions by about 600 Å in applications in which construction 100 is initially configured for utilization with 193 nanometer wavelength radiation and is to be converted to a configuration suitable for utilization with 248 nanometer wavelength radiation.

The first regions 102 of substrate 12 can be considered to be protected with at least patterned material 14 during the etch which reduced the thickness of second regions 104 of substrate 12, and in the shown embodiment are protected by both chrome-containing layer 16 and patterned material 14.

Patterned layer 14 is shown to comprise an unaltered thickness in the processing which converts the construction 100 from the configuration of FIG. 7 to that of FIG. 9. Specifically, layer 14 has an elevational thickness 130 at the processing step of FIG. 9 which is the same as the elevational thickness of layer 14 at the processing step of FIG. 7. The etch utilized to reduce a thickness of second regions 104 of substrate 12 may, as discussed above, be relatively non-selective for patterned material 14 relative to the material of substrate 12. In such instances, the etch can be conducted to be highly anisotropic so that the etch does not significantly alter patterned layer 14 along exposed sidewalls of the layer. However, even if the etch does remove some of material 14 from along sidewalls of the structures 122, the etch will not significantly affect an elevational thickness of layer 14 in aspects in which an upper surface of layer of 14 is protected by the chromium-containing material 16.

Figure 10:
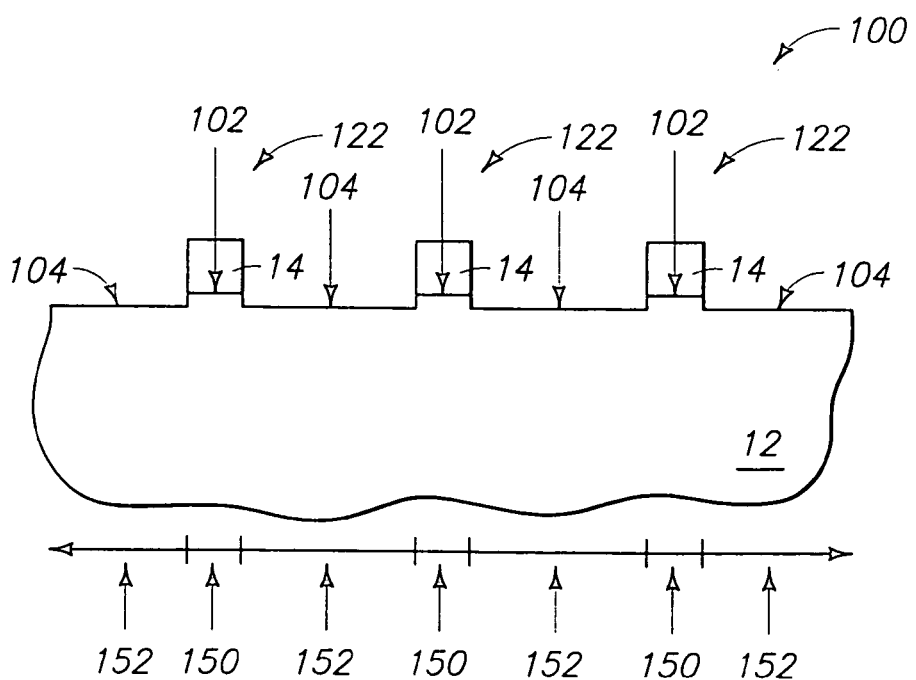
FIG. 10 is a view of the FIG. 7 reticle shown at a processing step subsequent to that of FIG. 9.

Referring to FIG. 10, chromium-containing layer 16 is removed from over patterned material 14. Typically, the chromium-containing layer will be removed only from within an interior region of a desired construction (with the interior region being shown as 26 in FIGS. 5 and 8) so that the chromium-containing layer remains around an outer periphery of the reticle analogously to the structure described previously with reference to prior art FIG. 5.

The construction of FIG. 10 can be considered to comprise first regions 150 and second regions 152. First regions 150 have a thickness corresponding to the combined thickness of patterned material 14 and first regions 102 of substrate 12, while second regions 152 have a thickness corresponding to the thickness of regions 104 of substrate 12.

The relationship between the thickness of regions 150 (i.e. the combined thickness of material 14 and thicker regions 102 of substrate 12) and the thickness of regions 152 (i.e., that the thickness of the thinned regions 104 of substrate 12) is preferably such that a phase of a desired radiation is shifted by 180° upon passing through regions 150 relative to passing through regions 152. The desired radiation utilized with the reticle of FIG. 10 will typically have a longer wavelength than the radiation for which the starting reticle of FIG. 7 was configured. Accordingly, if the starting reticle of FIG. 7 was configured for 157 nanometer wavelength radiation, the reticle of FIG. 10 can be configured for 193 nanometer wavelength radiation, 248 nanometer wavelength radiation or 365 nanometer wavelength radiation. Alternatively, if the reticle of FIG. 7 is configured for 193 nanometer wavelength radiation, the reticle of FIG. 10 can be configured for 248 nanometer wavelength radiation or 365 nanometer wavelength radiation. As another example, if the reticle of FIG. 7 is configured for 248 nanometer wavelength radiation, the reticle of FIG. 10 can be configured for utilization with 365 nanometer wavelength radiation.

The processing of FIGS. 7-10 can be considered to have taken a reticle configured for utilization with a short wavelength radiation (a later generation photolithographic radiation) and converted the reticle to a configuration suitable for utilization with a longer wavelength radiation (or in other words, an earlier generation photolithographic radiation).

An advantage of the processing of the present invention is described with reference to FIG. 11. The reticle 100 of FIG. 10 is shown in an inverted orientation relative to FIGS. 7-10, and is shown exposed to a radiation for which the reticle is configured (typically 193 nanometer wavelength radiation, 248 nanometer wavelength radiation, or 365 nanometer wavelength radiation), with the radiation being labeled as 160. The radiation passes through reticle 100 to form a pattern of transmission which is graphically illustrated on an opposing side of construction 100 from radiation 160. The graph illustrates that radiation passing through regions 150 of construction 100 is shifted substantially out of phase relative to radiation passing through regions 152. In other words, the radiation passing through regions 150 is shifted by about 180° relative to the radiation passing through regions 152. The shift in phase of the radiation passing through regions 150 relative to the radiation passing through regions 152 will typically be from about 170° to about 190° (i.e. 180°+/−10°), and can be from about 175° to about 185° (i.e. 180°+/−5°), and in particular applications will be from about 179° to about 189° (i.e. 184°+/−5°).

The patterned material 14 attenuates the longer wavelength radiation 160 less than the attenuation which would occur if the material were utilized with the shorter wavelength for which the reticle of FIG. 7 was initially designed. Specifically, as described above with reference to FIG. 6, the patterned regions 14 will typically attenuate radiation by at least 90%, and frequently by 94% or more when the patterned regions are utilized with a wavelength of radiation for which a reticle is designed. However, as shown in FIG. 11, when the reticle is utilized with a radiation having a longer wavelength than that which the reticle was initially designed for, the attenuation through patterned material 14 is less than 90% (shown by the absolute value of the transmission of radiation passing through regions 150 of construction 100 of FIG. 11 being greater than 10%).

In particular aspects of the invention, the attenuation of radiation 160 through regions 150 will be from about 50% to less than 90%, even though the attenuation of the radiation for which the reticle was initially designed (i.e., the attenuation of the radiation for which the reticle of FIG. 7 was designed) would be at least about 90%. Accordingly, if the reticle of FIG. 7 were designed for 157 nanometer wavelength radiation, and the reticle of FIG. 11 corresponded to the reticle of FIG. 7 converted through the processing of FIGS. 8-10 to be suitable for utilization with 193 nanometer wavelength radiation, the attenuation of the 157 nanometer wavelength radiation by reticle of FIG. 7 would be at least about 90%, whereas the attenuation of the 193 nanometer wavelength radiation by the reticle of FIG. 11 would be from about 50% to less than 90%. Similarly, if the reticle of FIG. 7 were initially configured for utilization with 193 nanometer wavelength radiation, and the reticle of FIG. 11 corresponded to a conversion of the reticle of FIG. 7 to a reticle suitable for utilization with 248 nanometer wavelength radiation, the reticle of FIG. 7 would typically have an attenuation of greater than about 90%, whereas the reticle of FIG. 11 would have an attenuation of from about 50% to less than about 90%. Similar relationships of the attenuation of the reticle of FIG. 7 relative to the reticle of FIG. 11 can occur in converting a reticle configured for utilization with 157 nanometer wavelength radiation to a reticle configured for utilization with 248 nanometer wavelength radiation or 365 nanometer wavelength radiation; or for converting a reticle configured for 193 nanometer wavelength radiation to a reticle configured for 365 nanometer wavelength radiation; or for converting a reticle configured for 248 nanometer wavelength radiation to a reticle configured for 365 nanometer wavelength radiation. Although the reticle of FIG. 11 can have an attenuation of less than 90% in various aspects of the invention, it is to be understood that the invention also encompasses aspects in which the attenuation is greater than 90% for the reticle of FIG. 11, including aspects in which the attenuation is about 95% or higher.

The attenuation of radiation 160 through regions 150 can alternatively be described as a transmission through regions 150. In preferred aspects, the transmission of radiation 160 through regions 150 will be from about 1% to about 50%. The transmission can be, for example, from about 8% to about 40%, from about 20% to about 40%, or in particular aspects can be about 28%.

Figure 11:
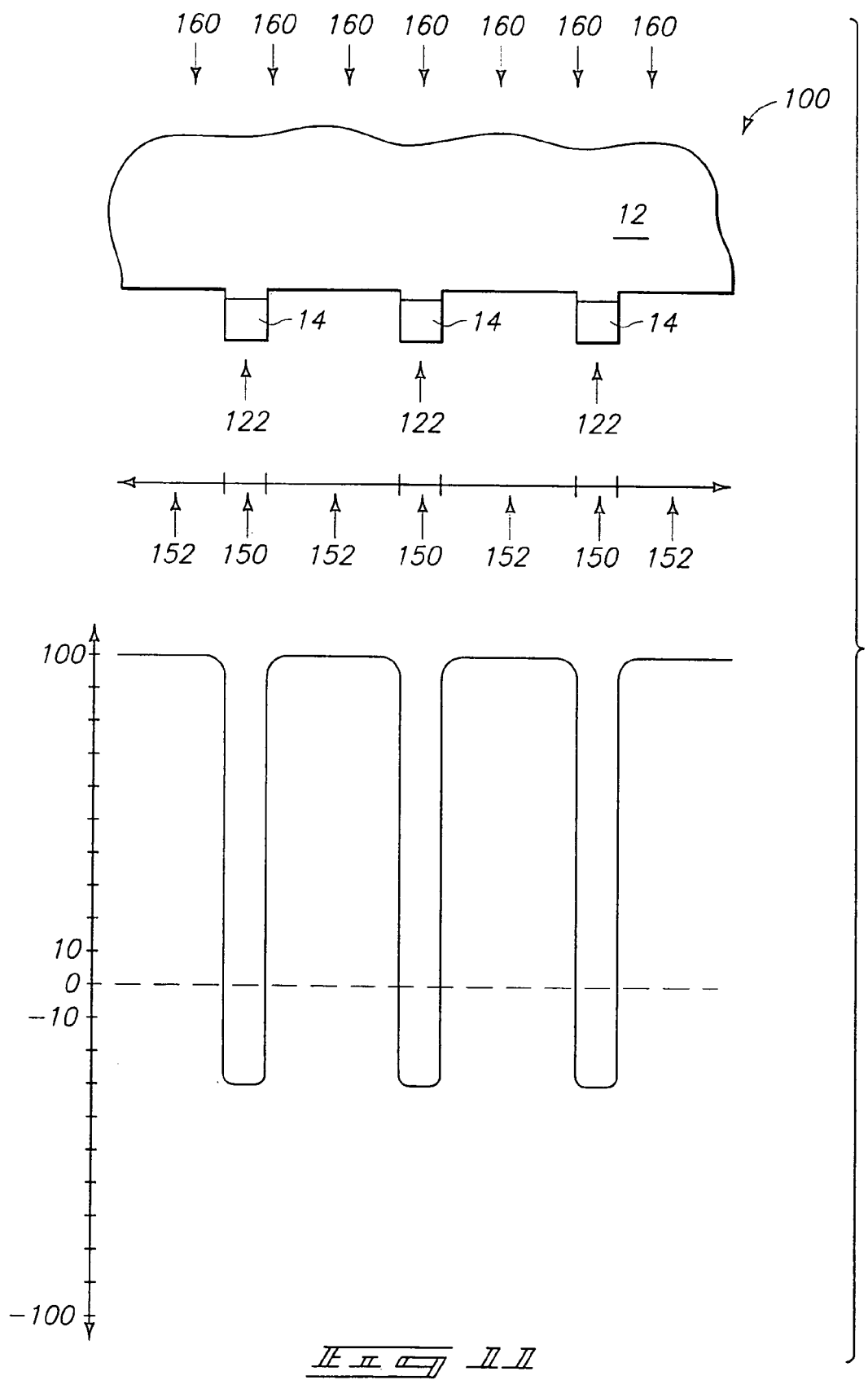
FIG. 11 is a view of the FIG. 10 reticle shown in combination with radiation directed toward the reticle, and further shown in combination with a graphical illustration of the percent transmission (% T) of the radiation through various portions of the reticle.

In an exemplary aspect, the reticle of FIG. 7 will be configured for utilization with 193 nanometer wavelength light, and will be configured so that a transmission through patterned masking layer 14 (in the absence of chrome layer 16) will be about 6%, and reticle 100 of FIG. 11 will correspond to a converted reticle formed from such 193 nanometer reticle and configured so that transmission of 248 nanometer wavelength radiation through regions 150 is about 28%.

Among the advantages of the present invention is that converted reticles formed by the present invention can have enhanced transmission through out-of-phase regions relative to prior art reticles from which the reticles of the present invention are formed. It can be advantageous to have enhanced transmission through the out-of-phase regions in order to take advantage of various interference effects to reduce undesired anomalies during photolithographic processing. The prior art reticles typically utilize less than 10% transmission through out-of-phase regions. Reticles formed in accordance with methodology of the present invention can have greater than 10% transmission, and in some aspects much more transmission as discussed above, which can provide substantially more interference effects than prior art reticles. In particular aspects of the invention, the increased interference effects achieved with reticles of the present invention can provide advantages during photolithographic processing which cannot be achieved with the prior art reticles from which the reticles of the present invention are formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of converting a reticle from a first configuration to a second configuration, comprising:
    providing the reticle in the first configuration, the first configuration including a quartz-containing material and a patterned layer consisting essentially of molybdenum and silicon over the quartz-containing material, the patterned layer overlapping first regions of the quartz-containing material and not overlapping second regions of the quartz-containing material, the first configuration being configured to pattern a first wavelength radiation into in-phase regions and out-of-phase regions as the first wavelength radiation passes through the first configuration; the out-of-phase regions of the first wavelength radiation being shifted by about 180° relative to the in-phase regions, and being attenuated by at least about 90% relative to the in-phase regions; and
    while protecting the first regions of the quartz-containing material with at least the patterned layer, etching the second regions of the quartz-containing material with a dry etch to convert the reticle to the second configuration; the second configuration being configured to pattern second wavelength radiation into in-phase regions and out-of-phase regions as the second wavelength radiation passes through the second configuration; the out-of-phase regions of the second wavelength radiation being shifted by about 180° relative to the in-phase regions, and being attenuated by less than 80% relative to the in-phase regions.

2. The method of claim 1 wherein a layer comprising chromium is over the patterned layer during the etching of the second regions of the quartz-containing material; and wherein the layer comprising chromium is removed from over at least some of the patterned layer after the etching of the second regions of the quartz-containing material.

3. The method of claim 1 wherein the dry etch utilizes $C_2F_6$.

4. The method of claim 1 wherein first configuration of the reticle comprises a thickness of first regions of the quartz-containing material which is about the same as the thickness of the second regions of the quartz-containing material, and which is about 250 mils; and wherein the etching reduces a thickness of the second regions of the quartz-containing material by about 600 Å.

5. A method for modifying a reticle comprising:
    obtaining a reticle that is commercially available, the reticle comprising a first configuration suitable for utilization with a first wavelength of radiation, the first configuration of the reticle comprising:
        a radiation-transmissive substrate;
        patterned radiation-attenuating material over the radiation-transmissive substrate; and
        an opaque layer over the patterned radiation-attenuating material; and
    after the obtaining, modifying the reticle to a second configuration suitable for utilization with a second wavelength of radiation different from the first wavelength.

6. The method of claim 5 wherein the second wavelength of radiation comprises a longer wavelength than the first wavelength of radiation.

7. The method of claim 5 wherein the patterned radiation-attenuating material comprises zirconium and oxygen.

8. The method of claim 5 wherein the patterned radiation-attenuating material comprises silicon, nitrogen and oxygen.

9. The method of claim 5 wherein the first configuration of the reticle attenuates the first wavelength of radiation at a first attenuation percentage, and wherein the second configuration of the reticle attenuates the second wavelength of radiation at a second attenuation percentage, the first attenuation percentage being different from the second attenuation percentage.

10. The method of claim 5 wherein the radiation-transmissive substrate comprises a thickness, and wherein the modifying comprises reducing the thickness of the substrate between portions of the patterned radiation-attenuation material.

11. The method of claim 5 further comprising, before the modifying, providing light through the first configuration of the reticle during a photolithographic process.

12. The method of claim 5 wherein the opaque layer comprises chromium.

13. A method for modifying a reticle comprising:
provide light through a reticle during a photolithographic process, the reticle comprising a first configuration suitable for utilization with a first wavelength of radiation, the first configuration of the reticle comprising a pattern of radiation-attenuating material over a substrate; and
after the providing, modifying the reticle to a second configuration suitable for utilization with a second wavelength of radiation different from the first wavelength, the modifying comprising removing portions of the substrate exposed between pattern portions of the radiation-attenuating material.

14. The method of claim 13 wherein the radiation-attenuating material comprises zirconium and oxygen.

15. The method of claim 13 wherein the first configuration of the reticle attenuates the first wavelength of radiation at a first attenuation percentage, and wherein the second configuration of the reticle attenuates the second wavelength of radiation at a second attenuation percentage, the first attenuation percentage being different from the second attenuation percentage.

16. The method of claim 13 wherein the radiation-attenuating material comprises silicon, nitrogen and oxygen.

17. The method of claim 13 wherein the second wavelength of radiation comprises a longer wavelength than the first wavelength of radiation.

18. The method of claim 13 wherein the substrate comprises a radiation-transmissive substrate.

19. The method of claim 13 further comprising an opaque layer over the radiation-attenuating material.

20. The method of claim 19 wherein the opaque layer comprises chromium.

* * * * *

UNITED STATES PATENT AND TRADEMARK OFFICE
CERTIFICATE OF CORRECTION

PATENT NO. : 7,592,105 B2
APPLICATION NO. : 11/486523
DATED : September 22, 2009
INVENTOR(S) : Randal W. Chance et al.

Page 1 of 1

It is certified that error appears in the above-identified patent and that said Letters Patent is hereby corrected as shown below:

On the Title page, in field (75), in "Inventors", in column 1, line 1, delete "Randall" and insert -- Randal --, therefor.

Signed and Sealed this

Twenty-fourth Day of November, 2009

David J. Kappos
*Director of the United States Patent and Trademark Office*